United States Patent [19]

Cho et al.

[11] Patent Number: 5,501,174
[45] Date of Patent: Mar. 26, 1996

[54] ALUMINUM METALLIZATION FOR SIGE DEVICES

[75] Inventors: Chih-Chen Cho; Hung-Yu Liu, both of Richardson, Tex.

[73] Assignee: Texas Instruments Incorporated, Dallas, Tex.

[21] Appl. No.: 224,355

[22] Filed: Apr. 7, 1994

[51] Int. Cl.$^6$ .................................................. C30B 23/08
[52] U.S. Cl. ..................... 117/108; 117/928; 437/245; 437/105
[58] Field of Search ..................... 117/108, 928; 437/245, 105, 203, 194

[56] References Cited

U.S. PATENT DOCUMENTS

| | | |
|---|---|---|
| 3,929,527 | 12/1975 | Chang et al. ............................ 117/108 |
| 4,325,776 | 4/1982 | Menzel ................................... 117/108 |
| 4,554,030 | 11/1985 | Haisma et al. ........................... 148/175 |
| 5,262,361 | 11/1993 | Cho et al. ............................... 117/108 |

*Primary Examiner*—Robert Kunemund
*Attorney, Agent, or Firm*—James E. Harris; Richard A. Stoltz; Richard L. Donaldson

[57] ABSTRACT

Single crystal aluminum is deposited on SiGe structures to form metal interconnects. Generally, a method of forming single crystal aluminum on $Si_{(1-x)}Ge_x$ is presented, including the steps of maintaining the substrate at certain temperature (e.g. between 300° C. and 400° C.) and pressure conditions (e.g. below $2 \times 10^{-9}$ millibar) while aluminum atoms are deposited by a vacuum evaporation technique. This is apparently the first method of depositing single crystal aluminum on SiGe surfaces. Novel structures are made possible by the invention, including epitaxial layers 34 formed on single crystal aluminum 32 which has been deposited on SiGe 30. Among the advantages made possible by the methods presented are thermal stability and resistance to electromigration.

4 Claims, 2 Drawing Sheets

ALUMINUM METALLIZATION FOR SIGE DEVICES

FIELD OF THE INVENTION

This invention generally relates to the fabrication of integrated circuits, and more specifically methods of providing metallization for device interconnections.

BACKGROUND OF THE INVENTION

Without limiting the scope of the invention, its background is described in connection with current methods of forming metal interconnects and other metal structures within integrated circuits, as an example.

Heretofore, in this field, polycrystalline aluminum has been widely used for metallization in integrated circuits because of its high conductivity, pattern-ability, good adherence and bondability, low cost, easy availability and ease of deposition. However, polycrystalline aluminum has poor electromigration resistance and can intermix with silicon. To solve these problems, small amounts of copper and silicon are added into the polycrystalline aluminum. The copper, however, makes the metal alloy difficult to plasma etch ant the silicon can precipitate and thus increase the electrical resistance of the metal path.

SUMMARY OF THE INVENTION

Integrated devices which contain single crystal regions of silicon and germanium (i.e. $Si_{(1-x)}Ge_x$, $0 \leq x \leq 1$) have recently been widely studied. SiGe devices offer potential benefits in several areas of technology. The bandgap of SiGe may be varied by varying the ratio of Si to Ge. This ability to precisely control variations in bandgap energy is understood to be an advantage in building high speed electronic devices as well as electro-optical devices.

While single crystal aluminum is known to exhibit high electromigration resistance and good thermal stability, it has not been widely used in the microelectronics industry (perhaps it has been thought that growing single crystal aluminum would be totally impractical). A process which allows deposition of single crystal aluminum on SiGe structures would be an advantage in the fabrication of SiGe devices and integrated circuits.

It has been discovered that single crystal aluminum may be deposited on SiGe structures to form metal interconnects. Generally, and in one form of the invention, a method for forming single crystal aluminum on $Si_{(1-x)}Ge_x$ is presented, including the steps of maintaining the substrate at certain temperature and pressure conditions while aluminum atoms are deposited by a vacuum evaporation technique.

This is apparently the first method of depositing single crystal aluminum on SiGe surfaces.

Among the advantages made possible by the novel methods presented are the well known advantages of single crystal aluminum as a metal interconnect—thermal stability and resistance to electromigration. In addition, electrical properties of the metal/semiconductor interface, such as the Schottky barrier height and the carrier mean free path, may be varied by the choice of silicon/aluminum lattice relation made possible by the invention.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings.

DETAILED DESCRIPTION OF THE PREFERRED EMBODIMENTS

Five types of aluminum films are deposited by the novel methods presented, depending on the substrate temperature and the germanium content of the substrate. These five deposition regimes are summarized by FIG. 1, which shows in general the deposition results versus approximate deposition temperature and substrate germanium content.

Polycrystalline aluminum

Figure 1:
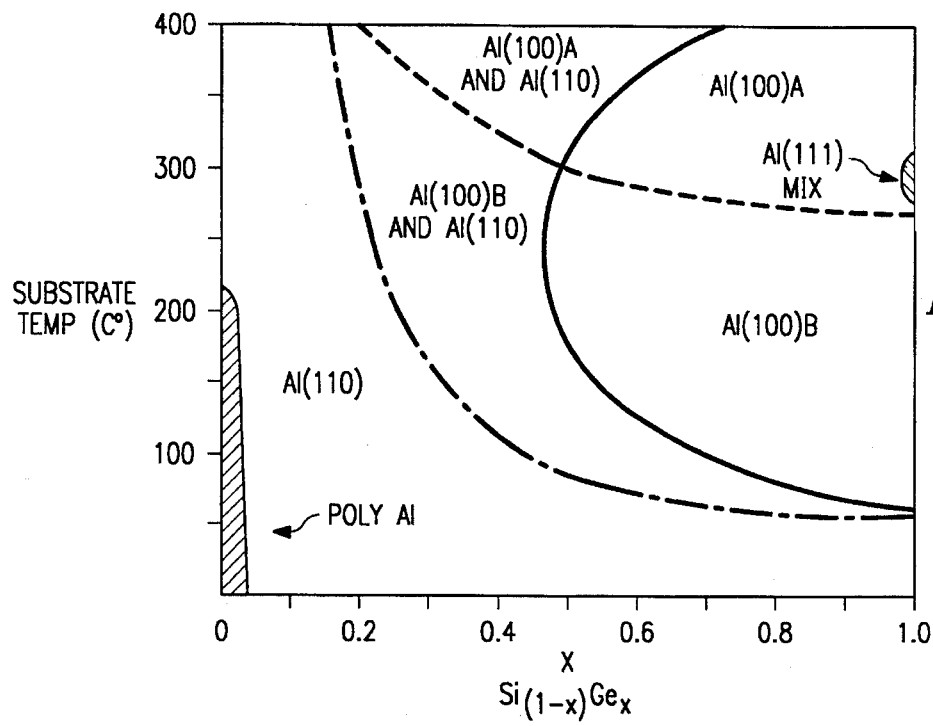
FIG. 1 is a graph of deposited film type vs. deposition temperature and substrate germanium content.

When the substrate temperature is maintained below approximately 200° C. and the substrate is Si(100) (i.e. there is no Ge content), a polycrystalline aluminum film with preferred orientation along the (111) direction is deposited. FIG. 1 shows the small range of deposition parameters which lead to deposition of polycrystalline aluminum. Polycrystalline aluminum results only when the fractional germanium content of the substrate is essentially zero.

Al(110)

Two sets of conditions generally result in Al(110) deposition: (1) a substrate temperature above about 200° C. when the Ge content is zero (i.e. the substrate is Si(100)); and (2) a broad range of substrate temperatures when the germanium content is greater than zero. FIG. 1 shows the combinations of substrate temperature and germanium which generally cause deposition of Al(110) on SiGe(100).

Since Si(100) and SiGe(100) surfaces are of four-fold symmetry while Al(110) surfaces exhibit two-fold symmetry, two domains of Al(110) with orientations rotated 90 azimuthally to each other result from these deposition parameters. The amounts of the two domains are equal because of the symmetric nature of the SiGe substrate. In depositions performed under these conditions, the size of each domain was measured to be approximately 2 μm.

An advantage of the invention is that, while deposition of single crystal aluminum on Si(100) substrates at temperatures below 200 ° C. has not been demonstrated, the addition of even a small amount of germanium to the substrate, as taught by this preferred embodiment, enables epitaxial deposition of aluminum.

B-type Al(100)

Generally, when the substrate is maintained between about 100° C. and about 300° C. and the Ge content of the substrate is above about 25%, B-type Al(100) films are deposited. "B-type" is a well known term of art which refers to a film with crystalline orientations identical to the orientations of an azimuthally rotated substrate. For a surface of four-fold symmetry such as SiGe(100), the rotation angle is 45° (or, equivalently, 135°, 225° or 315°).

FIG. 1 shows the range of substrate temperatures and germanium content which lead to B-type Al(100) deposition. As is shown, there is a transition region where both B-type Al(100) and Al(110) generally result, producing a polycrystalline film.

A-type Al(100)

When the substrate is maintained above about 300° C. and the Ge content is greater than about 35%, A-type Al(100) films are deposited. "A-type" is a well known term of art which refers to a film with crystalline orientations identical to the substrate (e.g. Al(111) on SiGe(111) and Al(110) on SiGe(110)).

FIG. 1 shows the range of substrate temperatures and germanium content which generally lead to the deposition of A-type Al(100) films. As can be seen, there are some deposition conditions which can cause deposition of both A-type Al(100) and Al(100) (i.e., a polycrystalline film).

Al(111)

A small amount of Al(111) is found mixed with the Al(100) when aluminum is deposited on Ge(100) at approximately 300° C.

The type of film deposited for each combination of substrate fractional germanium content and substrate temperature can be summarized as follows, where x is the fractional amount of germanium in the substrate ($0 \leq x \leq 1$) and T is the substrate temperature (in degrees Celsius) during deposition. The parameter ranges are approximate and are best understood with reference to FIG. 1.

Al(110) is deposited under two sets of conditions: (1) $0<x<0.5$ and $0<T<400$; and (2) $0.5<x<1$ and $0<T<100$. Al(110) is deposited exclusively under two sets of conditions: (a) $0<x<0.25$ and $0<T<400$, and (b) $0.25<x<1$ and $0<T<80$.

B-type Al(100) is deposited when $0.25<x<1.0$ and $100<T<300$. B-type Al(100) is deposited exclusively when $0.5<x<1.0$ and $80<T<300$.

A-type Al(100) is deposited when $0.35<x<1.0$ and $300<T<400$. A-type Al(100) is deposited exclusively when $0.6<x<1.0$ and $300<T<400$.

DEPOSITION PROCEDURE

Before aluminum deposition, a SiGe(100) epitaxial layer is formed. Si(100) wafers are cleaned by a conventional technique and introduced into a molecular beam epitaxy (MBE) chamber. The SiGe(100) surface layer is then formed by simultaneous epitaxial deposition of silicon and germanium. The composition of the resulting single crystal layer (i.e. the relative amounts of silicon and germanium within the layer) is controlled by the relative fluxes of the silicon and germanium sources within the MBE chamber during deposition. This thickness of the SiGe(100) layer is not critical. The resulting SiGe layer is referred to as the 'substrate' in later processing.

Single crystal aluminum was deposited on 4 inch diameter substrates in an ultrahigh-vacuum system composed of a MBE chamber and a metallization chamber. Wafers can be transferred between these chambers through an ultrahigh-vacuum transfer system, which is annexed with two sample introduction load locks. Base pressure of the MBE chamber and the metallization chamber were below $1 \times 10{-10}$ millibar and $1 \times 10^{-9}$ millibar, respectively. The process pressure during aluminum deposition was $2 \times 10^{-9}$ millibar.

After forming the epitaxial layer of SiGe(100), the wafers were transferred to the metallization chamber and 0.5 μm aluminum films were deposited from an electron beam evaporator at various substrate temperatures. The electron beam heating method produces a flux of electrically neutral aluminum atoms which traverse the metallization chamber and adhere to the SiGe substrate. Other methods of generating an aluminum flux may be used. While some metal deposition techniques use an ion-assisted process to obtain aluminum epitaxial deposition, the present invention uses neutral beam deposition (the constituents of the aluminum flux are not electrically charged). Neutral beam epitaxy is a simpler process which results in more uniform films, although non-neutral beam epitaxy may also be employed. The preferred rate of aluminum deposition is 18 nm/minute.

POSSIBLE LIMITS ON DEPOSITION TEMPERATURE

Deposition of Al(110) is expected to be possible at temperatures below 0° C. However, such deposition temperatures are considered non-viable because of the undesirability of cooling substrates to such temperatures during integrated circuit fabrication.

Deposition of Al(110) is expected to be possible at temperatures above 400° C., and probably as high as 500° C. The aluminum melting point of 550° C. places an absolute limit on the deposition temperature.

EXPERIMENTAL RESULTS

After deposition, an x-ray diffraction technique (the well-known 'rocking curve' method) was used to determine the crystalline quality of both the resulting aluminum films and the SiGe layer. When the thickness of the aluminum films is the same, the relative crystalline quality can be compared by the full-width-half-maximum (FWHM) of the aluminum rocking curve. Well-known transmission electron microscopy (TEM) techniques were also used to determine the orientation of the resulting epitaxial aluminum layers.

Figure 2A:
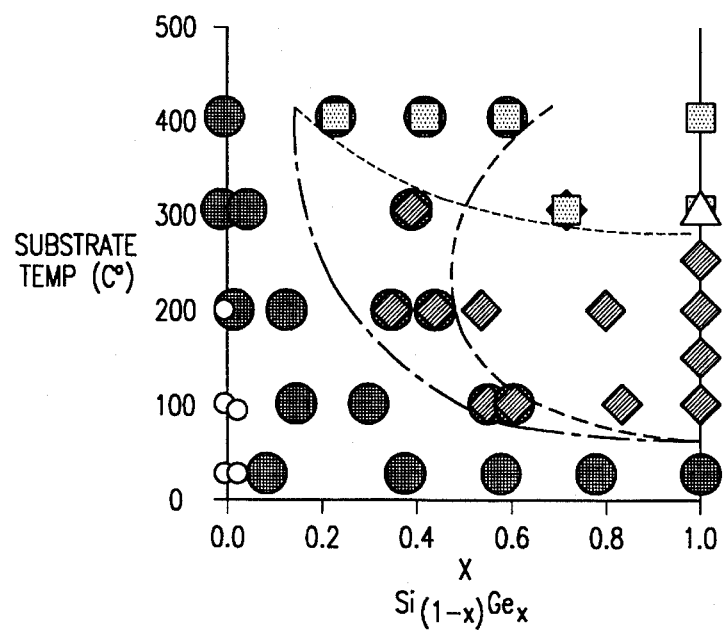
FIG. 2a is a graph showing deposition data points.
Figure 2B:
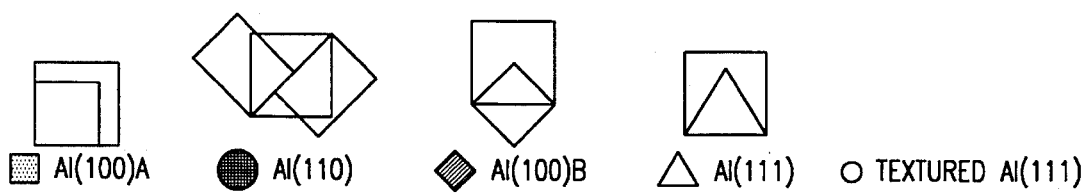
FIG. 2b is a key to FIG. 2a and shows the crystal orientations of the resulting aluminum films with respect to the substrate lattice.

FIG. 2a shows the type of aluminum film which resulted from each experiment. Each experiment differs from the others only in the substrate deposition temperature and the substrate germanium content. FIG. 2b gives the key to FIG. 2a, and in addition shows the aluminum crystalline structure in relation to the substrate lattice. The square which is common to each figure represents the substrate lattice. As FIG. 1 shows, there are three regions of substrate temperature/germanium content which give rise to the deposition of a single orientation of aluminum (Al(110), A-type Al(100), and B-type Al(100)), with some overlap of the regions.

Figure 3:
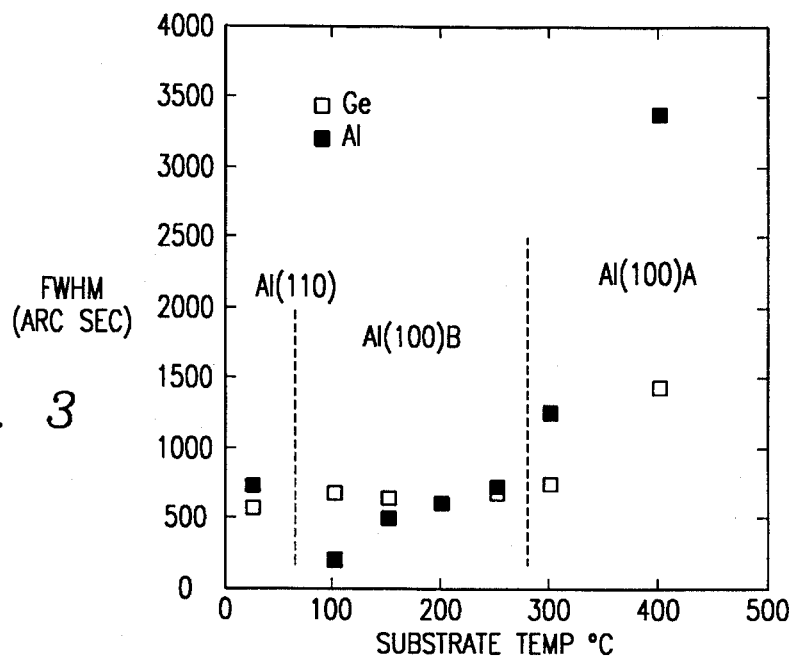
FIG. 3 is a graph of aluminum and germanium crystalline quality after aluminum deposition on Ge(100)

FIG. 3 is a graph which allows comparison of the crystalline quality of the various aluminum films deposited on Ge(100). The full-width of the rocking curve at half of its maximum (the so-called FWHM value) is an indicator of crystalline quality. When the thickness of the deposited film is the same for each sample, the rocking curve FWHM may used directly to compare crystalline quality. As FIG. 3 shows, the FWHM is smallest (and thus the crystalline quality greatest) when aluminum is deposited at 100° C. as Al(100). The crystalline quality of both Al and Ge degrades when the substrate growth temperature is above 300° C. because of Al/Ge mixing.

Figure 4:
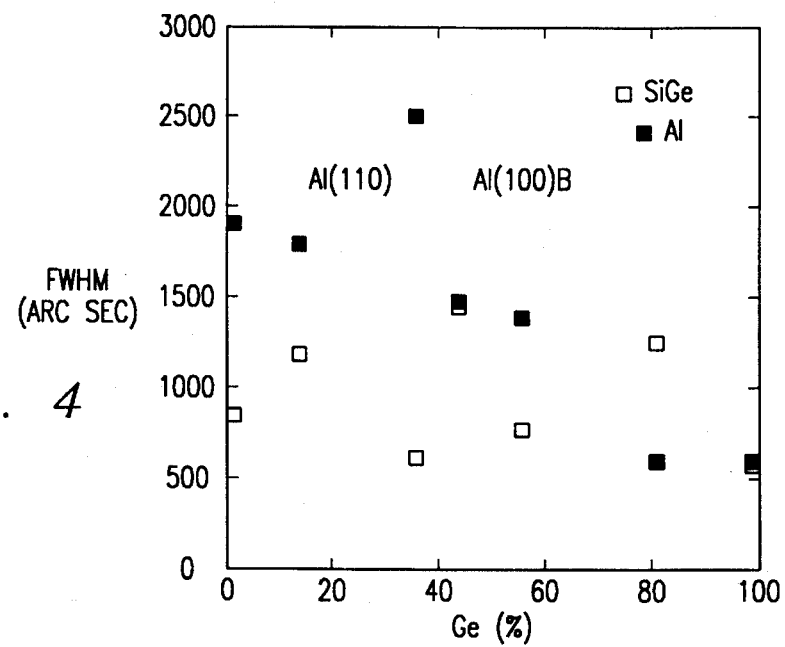
FIG. 4 is a graph of aluminum and SiGe crystalline quality after aluminum deposition on SiGe substrates of various levels of germanium content.

FIG. 4 shows the crystalline quality of aluminum films deposited at a single temperature (200° C.) on various SiGe(100) substrates. The aluminum quality is improved as the Ge content of the SiGe substrate increases. The crystalline quality of aluminum on a $Si_{0.85}Ge_{0.35}$ substrate is seen to be worse than that of other substrates. This relatively lower quality is possibly due to the boundaries between Al(110) and B-type Al(100). The data also shows that the crystalline quality of SiGe shows no dependence on Ge content. This is because there is no Al/Ge mixing at this deposition temperature.

NOVEL STRUCTURES

Figure 5:
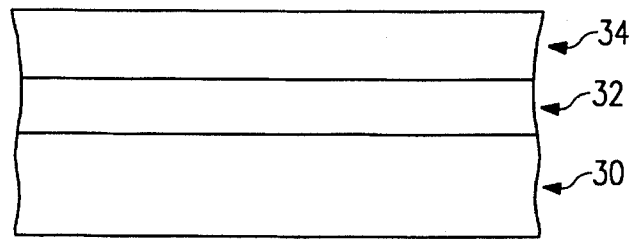
FIG. 5 shows a structure wherein a single crystal layer has been deposited on a single crystal aluminum film which is on a SiGe substrate.

This invention makes possible in general any structure which contains single crystal aluminum which is deposited on SiGe. The fractional Ge content may range from zero to one. In addition, the deposition of single crystal aluminum on SiGe makes possible further epitaxial depositions, as shown generally by FIG. 5. A single crystal aluminum layer 32 has been deposited on a substrate of SiGe 30, according to the present invention. Because of the single crystal nature of the aluminum film, further epitaxy is possible. FIG. 5 further shows a single crystal film 34 epitaxially deposited on aluminum 32. Such a structure has not previously been possible.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of depositing single crystal aluminum on $Si_{1-x}Ge_x$ of lattice orientation (100), X greater than 0 and less than 1, said method comprising:

selecting a substrate temperature corresponding to X such that the combination of X and said substrate temperature is represented in a graph region of FIG. 1 selected from the group of regions consisting of Al(110), Al(100) A and Al(100) B;

maintaining said $Si_{1-x}Ge_x$ at a pressure below approximately $2\times10^{-9}$ millibar;

maintaining said $Si_{1-x}Ge_x$ approximately at said substrate temperature; and directing an aluminum flux at said $Si_{1-xGex}$.

2. The method of claim 1, wherein said aluminum flux is electrically neutral.

3. The method of claim 1, further comprising depositing a single crystal film on said single crystal aluminum.

4. A method of depositing single crystal aluminum on $Si_{1-x}Ge_x$ of lattice orientation (100), X greater than 0 and less than approximately 0.25, said method comprising:

maintaining said $Si_{1-x}Ge_x$ at a pressure below approximately $2\times10^{-9}$ millibar;

maintaining said $Si_{1-x}Ge_x$ at a temperature greater than approximately 0° C. and less than approximately 200° C.; and directing an aluminum flux at said $Si_{1-x}Ge_x$;

whereby the addition of said germanium allows epitaxial deposition of single crystal aluminum at temperatures below approximately 200° C.

* * * * *